United States Patent
Cestra et al.

(10) Patent No.: US 7,776,739 B2
(45) Date of Patent: Aug. 17, 2010

(54) SEMICONDUCTOR DEVICE INTERCONNECTION CONTACT AND FABRICATION METHOD

(75) Inventors: Gregory K. Cestra, Pleasanton, CA (US); Michael Dunbar, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 870 days.

(21) Appl. No.: 11/223,367

(22) Filed: Sep. 9, 2005

(65) Prior Publication Data

US 2007/0059921 A1    Mar. 15, 2007

(51) Int. Cl.
  H01L 23/485  (2006.01)
  H01L 23/495  (2006.01)
  H01L 21/44  (2006.01)
(52) U.S. Cl. .................. 438/642; 438/618; 438/622; 257/751; 257/781; 257/784
(58) Field of Classification Search .................. None
  See application file for complete search history.

(56) References Cited

U.S. PATENT DOCUMENTS

| 4,577,212 | A | | 3/1986 | Hueckel et al. .......... 357/68 |
| 5,266,835 | A | * | 11/1993 | Kulkarni .................. 257/751 |
| 5,672,898 | A | * | 9/1997 | Keller et al. ............. 257/383 |
| 6,156,639 | A | | 12/2000 | Fukao et al. ............. 438/629 |
| 6,649,509 | B1 | * | 11/2003 | Lin et al. ................. 438/618 |
| 2003/0038341 | A1 | | 2/2003 | Bayraktaroglu | |

FOREIGN PATENT DOCUMENTS

JP    63021852    1/1988

OTHER PUBLICATIONS

PCT International Search Report: Jan. 18, 2007: 4 pps.: in International Application No. PCT/US2006/034660.
PCT Written Opinion of the International Searching Authority: Jan. 18, 2007; 5 pps.: in International Application No. PCT/US2006/034660.

* cited by examiner

Primary Examiner—Mary Wilczewski
Assistant Examiner—Pamela E Perkins
(74) Attorney, Agent, or Firm—Koppel, Patrick, Heybl & Dawson

(57) ABSTRACT

A semiconductor device interconnection contact and fabrication method comprises fabricating one or more active devices on a semiconductor substrate. A diffusion barrier layer is deposited over the devices, followed by an Al-based metallization layer. The diffusion barrier and metallization layers are masked and etched to define interconnection traces. Mask and etch steps are then performed to remove interconnection trace metallization that is in close proximity to the active device regions, while leaving the traces' diffusion barrier layer intact to provide conductive paths to the devices, thereby reducing metallization-induced mechanical stress which might otherwise cause device instability.

19 Claims, 3 Drawing Sheets

SECTION A-A

SEMICONDUCTOR DEVICE INTERCONNECTION CONTACT AND FABRICATION METHOD

BACKGROUND OF THE INVENTION

1. Field of the Invention

This invention relates to the field of semiconductor device interconnection contacts, and particularly to methods of fabricating such contacts so as to reduce mechanical stress.

2. Description of the Related Art

Precision analog integrated circuits (ICs) have always been sensitive to mechanical stresses encountered during the fabrication and assembly process. Such stresses can alter the electrical performance of otherwise identical devices. For example, two transistors forming a differential pair will ideally have identical electrical characteristics. However, mechanical stress—particularly in close proximity to the transistors' p-n junctions—can cause the two transistors to react differently to identical stimuli, thereby degrading the accuracy with which the circuit can operate.

One source of mechanical stress is the metallization that provides interconnections to the IC's active devices. For many device processes, the metal used to provide interconnections is aluminum based, typically aluminum copper (AlCu). Stress is built up in the Al film during device processing, and differential stress is added to the film during subsequent processing steps, especially during the cool down period following anneal. Interconnect Al in close proximity to an active device region, such as the base-emitter junction of a bipolar transistor (BJT), can cause instability in the device when subjected to temperature treatment. This can result in poor matching between active devices which are otherwise identical.

SUMMARY OF THE INVENTION

A semiconductor device interconnection contact and fabrication method are presented which overcome the problem noted above, by alleviating mechanical stress that might otherwise give rise to device instability during processing.

The present contact fabrication method comprises fabricating one or more devices, each of which comprises at least one p-n junction, on a semiconductor substrate. A diffusion barrier layer, typically a homogeneous metal such as titanium-tungsten (TiW) is deposited over the devices, and a metallization layer, typically an Al-based metal such as AlCu, is deposited on the diffusion barrier layer. The diffusion barrier and metallization layers are masked and etched to define interconnection traces. Then, mask and etch steps are performed so as to remove interconnection trace metallization that is in close proximity to at least one of the p-n junctions, while leaving the traces' diffusion barrier layer intact such that it provides conductive paths to the junctions. The removal of the interconnection trace metallization near the junctions serves to reduce mechanical stress—and thereby device instability—which might otherwise be present. Further features and advantages of the invention will be apparent to those skilled in the art from the following detailed description, taken together with the accompanying drawings.

BRIEF DESCRIPTION OF THE DRAWINGS

FIG. 1b is a cross-sectional view of some of the interconnection contacts shown in FIG. 1a.

DETAILED DESCRIPTION OF THE INVENTION

The present invention is a means to reduce mechanical stress in the junction area of active devices fabricated on a semiconductor substrate. The stress which is reduced is that which would otherwise arise due to interconnection metallization in close proximity to the junctions.

The present inventors have discovered that the random nature of the grain structure of Al interconnections can introduce a non-uniform stress to adjacent transistors, and thus cause errors in a circuit such as a differential pair. Stability through temperature treatments is also affected, as heat treatment after fabrication can cause stress relaxation in the Al, thereby introducing further errors into the differential pair.

The present invention reduces metallization-induced mechanical stress in the junction areas of an IC's active devices. This is accomplished by removing Al from the "critical areas"—i.e., areas in which metallization-induced mechanical stress can result in device instability—with contact to these areas being provided with a material that imparts less stress on the silicon. This reduces the mechanical stress on the critical device regions, and thus minimizes the error in precision devices that might otherwise be present.

Figure 1A:
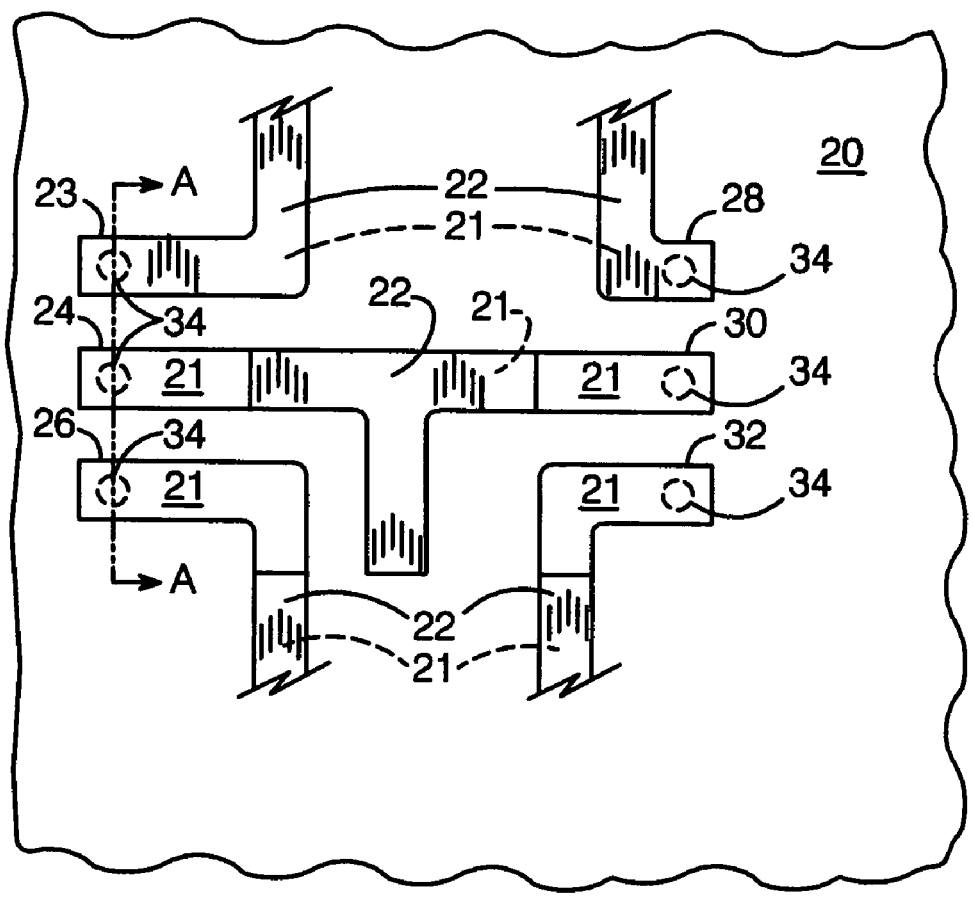
FIG. 1a is a plan view illustrating interconnection contacts per the present invention.
Figure 1B:
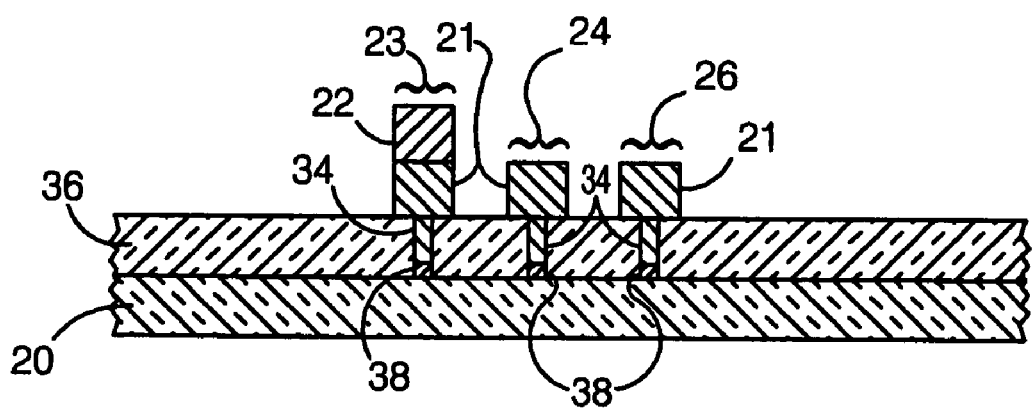

The present interconnection contact is illustrated in the plan view shown in FIG. 1a and the corresponding cross-sectional view (cut along section line A-A) shown in FIG. 1b. Here, two BJTs (not shown) have been fabricated on a substrate 20, and interconnection traces have been formed to provide respective contacts to the various transistor regions. Conventionally, each interconnection trace includes a diffusion barrier layer portion 21 and a metallization portion 22, with the metallization on top of the diffusion barrier layer. Here, traces 23, 24 and 26 provide connections to the collector, emitter and base, respectively, of a first transistor, and traces 28, 30 and 32 provide connections to the collector, emitter and base, respectively, of a second transistor. Conductive paths between the interconnection traces and the actual device regions would typically be effected with contact openings 34 through a dielectric layer 36. The fabrication process would typically be arranged to cause silicide 38 to be formed at the bottom of the contact openings, to facilitate low resistance electrical contacts.

The invention requires that metallization be removed in critical areas. As noted above, a region which is particularly sensitive to this type of metallization-induced mechanical stress is the base-emitter junction of a BJT. In FIGS. 1a and 1b, interconnection traces 24, 26, 30 and 32 extend into the transistors' base-emitter junction areas. In accordance with the invention, the metallization is removed from these traces where they are in close proximity to the base-emitter junctions. The underlying diffusion barrier layer is left intact, and serves as the sole conductive path where the metallization has been removed.

By removing the metallization in the junction areas as described above, transistor characteristics which might otherwise be unpredictably altered as the IC is processed are stabilized. For example, assume that, under prescribed conditions, a pair of adjacent BJTs have base-emitter voltages which are matched prior to an annealing step. The degree to which the base-emitter voltages remain matched following the anneal has been shown to be much higher when interconnection contacts per the present invention are employed.

Diffusion barrier layer 21 is preferably a homogeneous metal such as TiW or titanium nitride (TiN); as it provides the sole conductive path where metallization has been removed, the diffusion barrier layer's resistivity should be relatively low. Metallization layer 22 is Al-based, such as AlCu. It should be noted that a TiW diffusion barrier layer has a resistivity about 150 times higher than that of AlCu. Though the distances over which signals travel exclusively via TiW are relatively short, the TiW's additional resistance may need to be considered when designing circuits employing the present invention.

Note that, though the invention's use in a BJT's base-emitter junction region is described above, the present contact is not limited to this usage. The invention may be employed anywhere that metallization-induced mechanical stress presents a problem. Thus, the invention finds application in p-n junction areas generally, including those of BJTs, field-effect transistors (FETs), and diodes.

For a bipolar device, metallization should be removed over the entire base region. More metal may be removed if desired to account for alignment issues.

Figure 2:
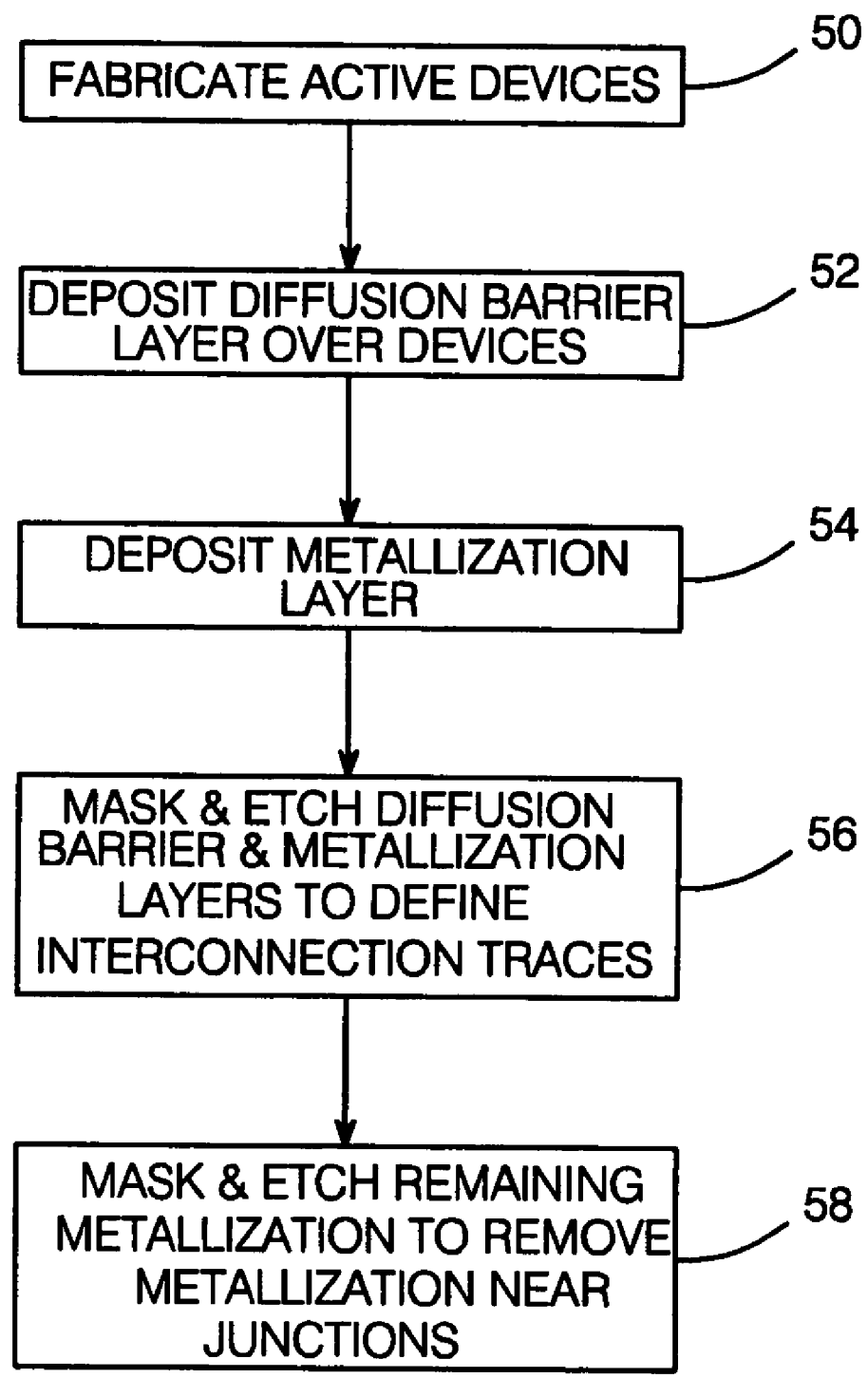
FIG. 2 is a diagram illustrating a fabrication method for an interconnection contact per the present invention.

A basic fabrication method for the present interconnection contact is shown in FIG. 2. First, one or more devices, each of which includes a p-n junction, is fabricated on an IC substrate (step 50). These devices may be formed by any of a number of processes—no particular active device fabrication sequence is required by the present invention.

Though in practice there are likely to be intervening process steps, the next essential step (52) is the deposition of a diffusion barrier layer over the devices formed in step 50. As noted above, this layer is preferably a homogeneous metal such as TiW or titanium nitride (TiN). A metallization layer, typically Al-based such as AlCu, is deposited on the diffusion barrier layer (step 54).

The diffusion barrier and metallization layers are masked and etched to form the IC's interconnection traces (step 56). At this point, the traces are intact, with both the diffusion barrier and metallization materials running the full length of the traces.

Metallization is removed from the critical areas in step 58. A mask is used to define the portions of each interconnection trace to be removed, which is accomplished with an etch step. This results in interconnection traces that are intact except in critical areas as defined above, where the metallization has been removed; in these areas, the diffusion barrier layer carries the signal current alone.

Figure 3:
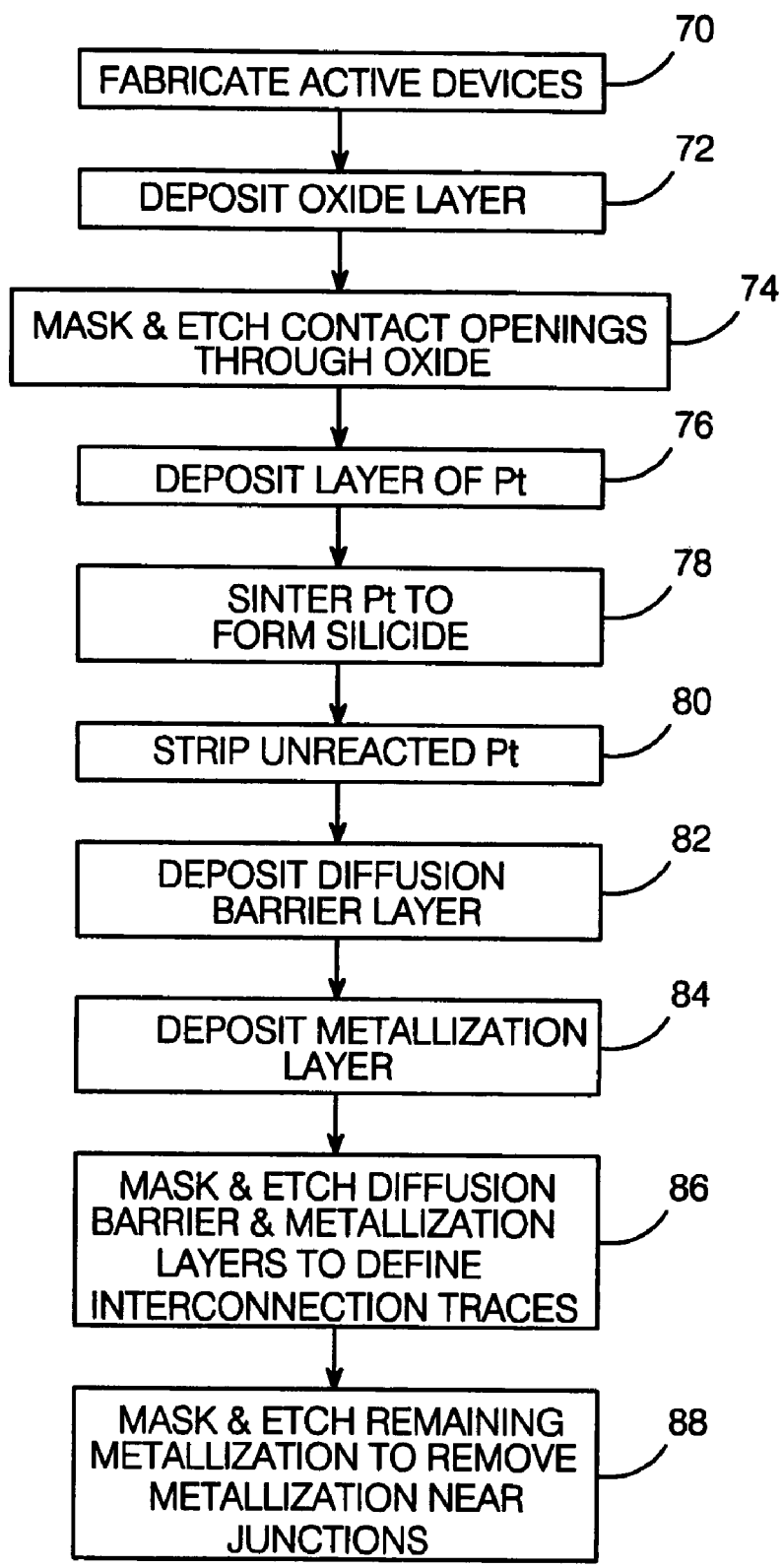
FIG. 3 is a diagram illustrating a more detailed fabrication method for an interconnection contact per the present invention.

A fabrication method for an interconnection contact per the present invention which includes process steps likely to be required in practice is shown in FIG. 3. As before, active devices are fabricated on an IC substrate by any of a number of processes (step 70). An oxide layer is then deposited over the devices (72), which is masked and etched as necessary to provide contact openings through the oxide layer to the active devices (74).

A metal layer such as platinum (Pt) is deposited over the wafer (76), and sintered in step 78. During the sinter, the Pt reacts only where it contacts the silicon (at the bottom of the contact openings). In this way, Pt silicide is formed at the bottom of the contact openings, which facilitates low resistance electrical contacts. Unreacted Pt is stripped away in step 80.

The diffusion barrier layer is deposited in step 82, and an Al-based metallization layer is deposited on the diffusion barrier layer (step 84). The diffusion barrier and metallization layers are masked and etched to form the IC's interconnection traces (step 86). Then, the remaining metallization is masked and etched to remove metal from the critical areas in step 88, resulting in interconnection traces that are intact except in critical areas as defined above.

Note that the process sequences described herein are merely exemplary; the invention could be practiced via many different fabrication sequences. It is only essential that the process used result in interconnect metallization being removed from areas in which metallization-induced mechanical stress can result in device instability, with the underlying diffusion barrier layer left intact to carry the signal current.

While particular embodiments of the invention have been shown and described, numerous variations and alternate embodiments will occur to those skilled in the art. Accordingly, it is intended that the invention be limited only in terms of the appended claims.

We claim:

1. A method of fabricating a semiconductor device interconnection contact, comprising:
    fabricating one or more devices, each of which comprises at least one p-n junction, on a semiconductor substrate;
    depositing a homogeneous metal diffusion barrier layer over said devices;
    depositing a metallization layer on said diffusion barrier layer;
    masking and etching said diffusion barrier and metallization layers to define interconnection traces to said devices; and
    performing mask and etch steps so as to remove the metallization layer portion of said interconnection traces in critical areas associated with at least one of said p-n junctions while leaving the diffusion barrier layer portion of said interconnection traces intact to provide the sole conductive paths in said critical areas, so as to reduce metallization-induced mechanical stress on said junction which might otherwise be present.

2. The method of claim 1, wherein said diffusion barrier layer comprises titanium-tungsten (TiW).

3. The method of claim 1, wherein said metallization layer comprises aluminum (Al).

4. The method of claim 3, wherein said metallization layer comprises aluminum-copper (AlCu).

5. The method of claim 1, wherein said devices are bipolar transistors.

6. The method of claim 5, wherein said at least one p-n junction comprises the base-emitter junctions of said bipolar transistors.

7. A semiconductor device interconnection contact, comprising:
    fabricating one or more bipolar transistors, each of which comprises at least one p-n junction, on a semiconductor substrate;
    depositing a homogeneous metal diffusion barrier layer over said transistors;
    depositing a metallization layer on said diffusion barrier layer;
    masking and etching said diffusion barrier and metallization layers to define interconnection traces to said transistors; and
    performing mask and etch steps so as to remove the metallization layer portion of said interconnection traces in critical areas associated with at least one of said p-n junctions while leaving the diffusion barrier layer portion of said interconnection traces intact to provide the sole conductive paths in said critical areas, so as to reduce metallization-induced mechanical stress on said junction which might otherwise be present;
wherein said at least one p-n junction comprises the base-emitter junctions of said bipolar transistors;
wherein said interconnection trace metallization is removed over the entire base regions of said base-emitter junctions.

8. The method of claim 1, further comprising:
depositing a dielectric layer on said devices; and
masking and etching said dielectric layer so as to provide contact openings to said p-n junctions, said dielectric layer deposited, masked and etched prior to the deposition of said diffusion barrier layer.

9. The method of claim 8, further comprising:
depositing a layer of metal over said contact openings;
sintering said metal to form silicide; and
stripping said metal to remove unreacted metal, said metal layer deposited, sintered and stripped prior to the deposition of said diffusion barrier layer.

10. A method of fabricating a semiconductor device interconnection contact, comprising:
fabricating one or more active devices, each of which comprises at least one p-n junction, on a semiconductor substrate;
depositing a dielectric layer over said devices;
masking and etching said dielectric layer to provide contact openings to said junctions;
depositing a layer of titanium-tungsten (TiW) over said devices;
depositing a aluminum-based metallization layer over said TiW layer;
masking and etching said TiW and metallization layers to define interconnection traces to said devices; and
performing mask and etch steps so as to remove the metallization layer portion of said interconnection traces in critical areas associated with at least one of said p-n junctions while leaving the TiW layer portion of said interconnection traces intact to provide the sole conductive paths in said critical areas, so as to reduce metallization-induced mechanical stress on said junction which might otherwise be present.

11. The method of claim 10, wherein said metallization layer comprises aluminum-copper (AlCu).

12. The method of claim 10, wherein said at least one p-n junction comprises the base-emitter junctions of respective bipolar transistors.

13. The method of claim 10, further comprising:
depositing a layer of metal over said contact openings;
sintering said metal to form silicide; and
stripping said metal to remove unreacted metal, said metal layer deposited, sintered and stripped prior to the deposition of said TiW layer.

14. A semiconductor device interconnection contact, comprising:
a substrate;
one or more devices, each of which comprises at least one p-n junction, on said substrate;
interconnection traces which provide electrical contacts to said p-n junctions, said traces comprising:
a homogeneous metal diffusion barrier layer, and
a metallization layer, said diffusion barrier and metallization layer masked and etched to define said traces, said contact arranged such that the metallization layer portion of said interconnection traces is removed in critical areas associated with at least one of said p-n junctions, such that the diffusion barrier layer portion of said interconnection traces provides the sole conductive paths in said critical areas, so as to reduce metallization-induced mechanical stress on said junction which might otherwise be present.

15. The contact of claim 14, wherein said diffusion barrier layer comprises titanium-tungsten (TiW).

16. The contact of claim 14, wherein said metallization layer comprises aluminum (Al).

17. The contact of claim 14, wherein said devices are bipolar transistors and said at least one p-n junction comprises the base-emitter junctions of said bipolar transistors.

18. The contact of claim 14, further comprising a dielectric layer between said devices and said interconnection traces, said dielectric layer masked and etched so as to provide contact openings to said p-n junctions.

19. The contact of claim 18, further comprising a layer of metal over said contact openings, said layer of metal sintered to form silicide and stripped to remove unreacted metal.

* * * * *